(12) United States Patent
Jang

(10) Patent No.: US 11,546,996 B2
(45) Date of Patent: Jan. 3, 2023

(54) ELECTRONIC DEVICE MODULE

(71) Applicant: SAMSUNG ELECTRO-MECHANICS CO., LTD., Suwon-si (KR)

(72) Inventor: Jung Mok Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/031,029

(22) Filed: Sep. 24, 2020

(65) Prior Publication Data

US 2021/0410288 A1    Dec. 30, 2021

(30) Foreign Application Priority Data

Jun. 25, 2020    (KR) .................. 10-2020-0077613

(51) Int. Cl.
| | | |
|---|---|---|
| H05K 1/18 | (2006.01) | |
| H01L 23/49 | (2006.01) | |
| H01L 23/498 | (2006.01) | |
| H01L 23/31 | (2006.01) | |
| H01L 23/552 | (2006.01) | |

(52) U.S. Cl.
CPC ......... H05K 1/186 (2013.01); H01L 23/3121 (2013.01); H01L 23/49 (2013.01); H01L 23/49811 (2013.01); H01L 23/552 (2013.01); H05K 2201/10287 (2013.01); H05K 2201/10931 (2013.01); H05K 2201/10977 (2013.01)

(58) Field of Classification Search
CPC ... H05K 1/11; H05K 1/14; H05K 1/18; H05K 1/181–187; H01L 23/00; H01L 23/19; H01L 23/29; H01L 23/31; H01L 23/48; H01L 23/56; H01L 23/66; H01L 23/367; H01L 23/498; H01L 23/552
USPC ................ 361/760–764, 784, 800, 816, 818; 174/262–268, 520–525; 257/659–690, 257/787–790
See application file for complete search history.

(56) References Cited

U.S. PATENT DOCUMENTS

| | | | | |
|---|---|---|---|---|
| 6,603,154 B2 * | 8/2003 | Sakai | .................. | H01L 23/3121 257/166 |
| 7,187,071 B2 * | 3/2007 | Tsuneoka | ............... | H05K 1/186 257/E23.079 |
| 7,633,765 B1 * | 12/2009 | Scanlan | .................. | H01L 24/18 361/760 |

(Continued)

FOREIGN PATENT DOCUMENTS

KR    10-1218989 B1    1/2013

*Primary Examiner* — Tuan T Dinh
(74) *Attorney, Agent, or Firm* — NSIP Law

(57) ABSTRACT

An electronic device module includes: a substrate; a sealing portion disposed on the substrate; at least one electronic device mounted on the substrate and embedded in the sealing portion; and a roof wiring at least partially disposed on a surface of the sealing portion and electrically connecting the substrate to the at least one electronic device or electrically connecting electronic devices, among the at least one electronic device, to each other. The roof wiring includes: a surface wiring disposed on one surface of the sealing portion; and at least one post wiring connecting the surface wiring to the substrate or to the at least one electronic device, and wherein at least a portion of a circumferential surface of the at least one post wiring is bonded to the surface wiring.

18 Claims, 11 Drawing Sheets

(56) References Cited

U.S. PATENT DOCUMENTS

| | | | |
|---|---|---|---|
| 7,928,552 B1* | 4/2011 | Cho | H01L 23/552 |
| | | | 257/686 |
| 8,125,788 B2* | 2/2012 | Hatanaka | H03H 9/0542 |
| | | | 361/764 |
| 8,315,060 B2* | 11/2012 | Morikita | H05K 1/0218 |
| | | | 361/764 |
| 8,399,972 B2 | 3/2013 | Hoang et al. | |
| 8,404,520 B1* | 3/2013 | Chau | H01L 25/105 |
| | | | 438/109 |
| 9,007,273 B2* | 4/2015 | Liao | H01Q 1/526 |
| | | | 343/841 |
| 10,319,688 B2* | 6/2019 | Wolter | H01Q 1/50 |
| 10,381,326 B2* | 8/2019 | Woychik | H01L 24/02 |
| 10,861,759 B2* | 12/2020 | Nomiyama | H01G 4/30 |
| 2011/0229708 A1* | 9/2011 | Asami | H01L 24/97 |
| | | | 428/316.6 |
| 2013/0015544 A1 | 1/2013 | Han et al. | |
| 2013/0032944 A1* | 2/2013 | Sato | H01L 23/48 |
| | | | 257/774 |
| 2013/0292808 A1* | 11/2013 | Yen | H01L 21/561 |
| | | | 257/E23.114 |
| 2017/0179039 A1* | 6/2017 | Lee | H01L 21/4853 |
| 2017/0295643 A1* | 10/2017 | Suzuki | H01L 23/552 |
| 2017/0347462 A1* | 11/2017 | Miwa | H01L 23/552 |
| 2018/0358317 A1* | 12/2018 | Albers | H01L 21/4857 |
| 2019/0310687 A1* | 10/2019 | Hong | G06F 1/1698 |

* cited by examiner

I-I'

II-II'

ELECTRONIC DEVICE MODULE

CROSS-REFERENCE TO RELATED APPLICATIONS

This application claims the benefit under 35 U.S.C. § 119(a) of Korean Patent Application No. 10-2020-0077613 filed on Jun. 25, 2020 in the Korean Intellectual Property Office, the entire disclosure of which is incorporated herein by reference for all purposes.

BACKGROUND

1. Field

The following description relates to an electronic device module.

2. Description of Related Art

There has been increased demand for portable electronic products on the electronic products market. For example, there has been increased demand for portable electronic devices having reduced size and weight. To meet such demand, electronic devices mounted on portable electronic products have been required to have a reduced size and weight.

To reduce sizes and weights of such electronic devices, a technique of reducing a size of an individual mounting component, and also a technique of a system-on-chip (SOC) for configuring a plurality of individual devices on a single chip or a technique of a system-in-package (SIP) for integrating a plurality of individual devices as a single package have been required.

However, when a plurality of devices are disposed on a single substrate, it may be difficult to electrically connect the devices to each other due to a spatial limitation. Thus, there has been demand for an electronic device module having an improved wiring structure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes: a substrate; a sealing portion disposed on the substrate; at least one electronic device mounted on the substrate and embedded in the sealing portion; and a roof wiring at least partially disposed on a surface of the sealing portion and electrically connecting the substrate to the at least one electronic device or electrically connecting electronic devices, among the at least one electronic device, to each other. The roof wiring includes: a surface wiring disposed on one surface of the sealing portion; and at least one post wiring connecting the surface wiring to the substrate or to the at least one electronic device, and wherein at least a portion of a circumferential surface of the at least one post wiring is bonded to the surface wiring.

The at least one post wiring may penetrate the surface wiring.

An entire circumferential surface of an upper portion of the at least one post wiring protruding externally of the sealing portion may be bonded to the surface wiring.

A circumferential surface of an upper portion of the at least one post wiring may be bonded to the surface wiring, and a circumferential surface of another portion of the at least one post wiring may be bonded to the sealing portion.

The at least one post wiring may be formed of a bonding wire.

The roof wiring may electrically connect at least two electronic devices, among the plurality of electronic devices, that are spaced apart from each other. Another electronic device, among the plurality of electronic devices, may be disposed between the at least two electronic devices.

The sealing portion may include a first sealing portion on a surface of which the surface wiring is disposed, and a second sealing portion covering the surface wiring and layered on the first sealing portion. The electronic device module may further include a shielding film disposed along outer surfaces of the first sealing portion and the second sealing portion.

The surface wiring may be formed in a lattice pattern in which a plurality of horizontal linear lines and a plurality of vertical linear lines intersect each other.

The at least one post wiring may include a plurality of post wirings spaced apart from each other by a predetermined gap along a circumference of the surface wiring.

The electronic device may be disposed between the surface wiring and the substrate.

The surface wiring may be formed such that a horizontal linear line of the surface wiring and a vertical linear line of the surface wiring intersect each other.

The at least one electronic device may include a lower electronic device disposed on the substrate and an upper electronic device disposed on an upper surface of the lower electronic device. Either one or both of the upper device and the lower device may be connected to the roof wiring.

The sealing portion may include a stepped portion formed on a surface of the sealing portion. The surface wiring may be disposed along a surface of the sealing portion.

The sealing portion may include: a first sealing portion including a first thickness portion and a second thickness portion having a thickness less than a thickness of the first thickness portion; and a second sealing portion covering the surface wiring and layered on the first sealing portion.

The at least one electronic device may include a large-sized electronic device spaced apart from the roof wiring and having a height greater than a height of the roof wiring.

The electronic device module may further include: an electronic device disposed on a surface of the first sealing portion and bonded to the roof wiring.

In another general aspect, an electronic device module includes: a substrate; an electronic device mounted on a first surface of the substrate; at least one post wiring extending to the substrate or the electronic device; a first sealing portion sealing the electronic device and the post wiring, and including a first thickness portion and a second thickness portion having a thickness less than a thickness of the first thickness portion; a surface wiring disposed on a surface of the second thickness portion and connected to a post wiring among the at least one post wiring; and a second sealing portion covering the surface wiring and layered on the second thickness portion.

The electronic device may be disposed in the second thickness portion.

The electronic device module may further include an additional electronic device disposed in the first thickness portion. A height of the additional electronic device may be greater than a height of the electronic device, in a direction of the thickness of the first thickness portion and the thickness of the second thickness portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
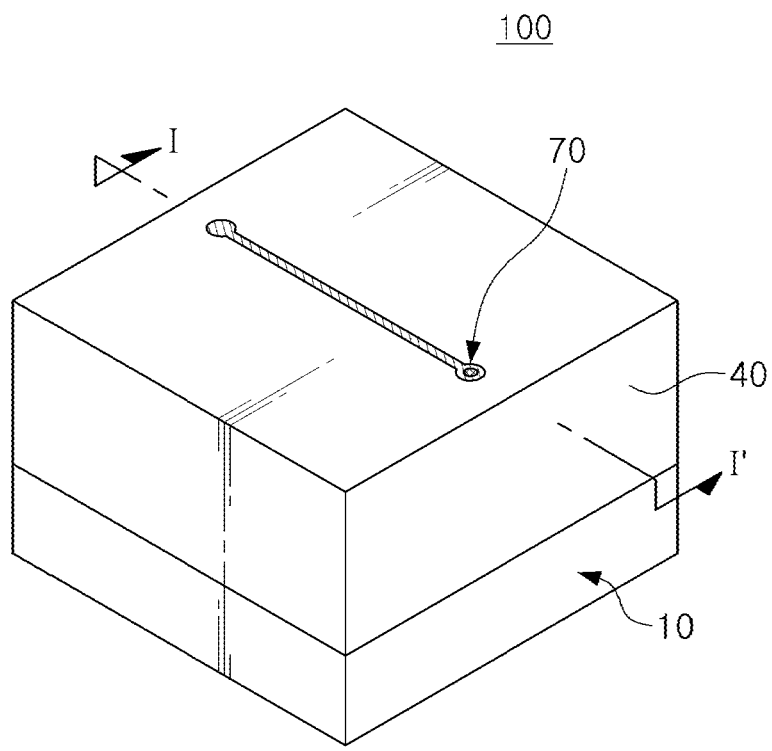
FIG. 1 is a perspective diagram illustrating an electronic device module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Figure 2:
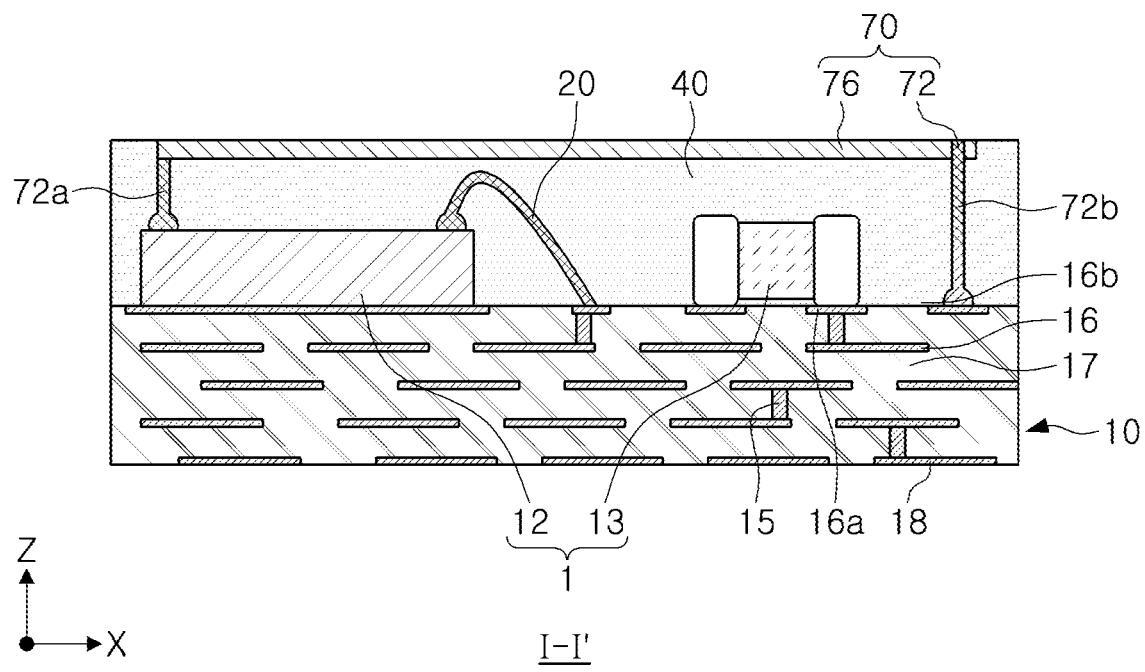
FIG. 2 is a cross-sectional diagram along line I-I' in FIG. 1.

FIG. 1 is a perspective diagram illustrating an electronic device module 100, according to an embodiment. FIG. 2 is a cross-sectional diagram along line I-I' in FIG. 1.

Referring to FIGS. 1 and 2, the electronic device module 100 may include, for example, a substrate 10, an electronic device 1a sealing portion 40, and a roof wiring 70.

The substrate 10 may be a multilayer substrate formed by alternately layering a plurality of insulating layers 17 and a plurality of wiring layers 16. However, if desired, the substrate 10 may be configured as a double-sided substrate in which wiring layers 16 are formed on both surfaces of a single insulating layer 17. For example, various types of generally used substrates (e.g., a printed circuit board, a flexible substrate, a ceramic substrate, a glass substrate, or the like) may be used as the substrate 10.

A material of the insulating layers 17 may not be limited to any particular material. For example, an insulating material such as a thermosetting resin, such as an epoxy resin, a thermoplastic resin, such as a polyimide resin, or a resin in which the thermosetting resin or the thermoplastic resin is impregnated in a core material such as a glass fiber (glass cloth or glass fabric) along with an inorganic filler, such as prepreg, an Ajinomoto build-up film (ABF), FR-4, bismaleimide triazine (BT), or the like, may be used.

The wiring layer 16 may be electrically connected to the electronic device 1, and may also be electrically connected to the roof wiring 70.

A conductive material such as copper (Cu), aluminum (Al), silver (Ag), tin (Sn), gold (Au), nickel (Ni), lead (Pb), titanium (Ti), or alloys of copper (Cu), aluminum (Al), silver (Ag), tin (Sn), gold (Au), nickel (Ni), lead (Pb), and titanium (Ti), may be used as a material of the wiring layers 16.

Interlayer connection conductors 15 for connecting the layered wiring layers 16 to each other may be disposed in the insulating layers 17.

An insulating protective layer may be disposed on a surface of the substrate 10. The insulating protective layer may be formed of solder resist, and may be disposed to cover an upper surface of the uppermost insulating layer 17 and the uppermost wiring layer 16, and a lower surface of the lowermost insulating layer 17 and the lowermost wiring layer 16, such that the insulating protective layer may protect the uppermost and lowermost wiring layers 16.

The substrate 10 may include a first surface and a second surface opposing the first surface. The first surface mounted (e.g., the upper surface) may be a surface on which the electronic devices are, and the second surface (e.g., the lower surface) may be a surface facing a main substrate when the electronic device module 100 is mounted on the main substrate.

Electrodes 16a for mounting (e.g., mounting electrodes), which may be used to mount the electronic device 1, may be disposed on the first surface of the substrate 10. Additionally, at least one ground electrode 16b may be disposed on the first surface of the substrate 10.

Connection electrodes 18 to which a terminal for external connection, such as a solder ball, may be connected, may be disposed on the second surface of the substrate 10. Accordingly, the electronic device module 100 may be electrically connected to an external entity through the connection electrodes 18 and the terminals for external connection.

The electronic device 1 may be mounted on the first surface of the substrate 10. The electronic device 1 may include various devices such as an active device and a passive device. For example, any devices or components mountable on the substrate 10 may be used as the electronic device 1.

Also, the electronic device 1 may also include a device which emits electromagnetic waves, or which should be protected from electromagnetic waves entering from the outside environment.

The sealing portion 40 may be disposed on the first surface of the substrate 10 and may seal the electronic device 1. The sealing portion 40 may fasten the electronic device 1 by externally surrounding the electronic device 1 such that the sealing portion 40 may protect the electronic device 1 from external impacts.

The sealing portion 40 may be formed of an insulating material. For example, the sealing portion 40 may be formed of a resin material such as an epoxy molding compound (EMC), but a material of the sealing portion 40 is not limited to an EMC.

The roof wiring 70 may be a wiring disposed along a surface of the sealing portion 40, rather than the substrate 10. Accordingly, the roof wiring 70 may be used to electrically connect at least one electronic device 1 to the substrate 10 or to electrically connect a plurality of electronic devices 1, which are spaced apart from each other, to each other.

To this end, the roof wiring 70 in the example embodiment may include a post wiring 72 penetrating the sealing portion 40 and a surface wiring 76 disposed along a surface of the sealing portion 40. For example, the surface wiring 76 may be disposed on an upper surface of the sealing portion 40. The post wiring 72 may be disposed to penetrate the sealing portion 40 in a thickness direction (a Z direction in FIG. 2) of the electronic device module 100. One end of the post wiring 72 may be bonded to the electronic device 1 and the other end of the post wiring 72 may be connected to the surface wiring 76.

As an example, the post wiring 72 may be formed of a bonding wire typically used for a general wire bonding process. For example, one end of the bonding wire may be bonded to the substrate 10 or the electronic device 1, and the bonding wire may be lead out and extended in the thickness direction of the sealing portion 40 such that the post wiring 72 is formed in columnar form.

The post wiring 72 is not limited to a bonding wire, and various modifications may be made to the configuration described above. For example, the post member 72 may be formed of a member such as a metal pillar mounted on the substrate 10 or the electronic device 1. When the electronic device module 100, which uses a bonding wire for electrically connecting the electronic device 1 and the substrate 10 to each other is manufactured, and the post wiring 72 is formed using a bonding wire, a number of manufacturing processes and a manufacturing time may be reduced.

A plurality of post wirings 72 may be provided. The surface wiring 76 may be disposed on a surface of the sealing portion 40 and may be electrically connected to the post wirings 72. Both ends of the surface wiring 76 in the example embodiment may be connected to the post wirings 72 exposed externally of the sealing portion 40 and may electrically connect two post wirings 72 to each other. However, an example embodiment thereof is not limited thereto, and various modifications may be made. For example, the surface wiring 76 may be connected to only one post wiring 72 and may be configured to function as an antenna or a shielding member.

The surface wiring 76 may be formed by filling a groove 45 formed in a surface of the sealing portion 40 with a conductive material. For example, the surface wiring 76 may be arranged by forming the groove 45 on the upper surface of the sealing portion 40, filling the groove 45 with a conductive material in a paste state, and curing the conductive material. However, the surface wiring 76 is not limited to this example, and a liquid conductive material may be used, or a plating method may be used.

The surface wiring 76 in the example embodiment may be formed in linear form. However, the surface wiring 76 is not limited to this configuration, and the surface wiring 76 may be configured to have a predetermined area. Also, a line width or a thickness of the surface wiring 76 may be varied.

The post wirings 72 and the surface wiring 76 may be formed by different processes, and accordingly, the post wirings 72 and the surface wiring 76 may be formed of different materials. However, the disclosure is not limited to this example.

Referring to FIG. 2, an upper end surface of one of the post wirings 72 (element 72a; hereafter, a first post wiring) may be configured to be in contact with the surface wiring 76, and a circumferential surface of the other another one of the post wirings 72 (element 72b, hereinafter a second post wiring) may be configured to be in contact with the surface wiring 76.

According to an example, a diameter of the first post wiring 72a is relatively large. Accordingly, a cross-sectional surface of the first post wiring 72a is configured as a bonding area bonded to the surface wiring 76, and a sufficient bonding area may be secured.

According to an example, a diameter of the second post wiring 72b is relatively small. Thus, a cross-sectional surface of the second post wiring 72b may be extremely narrow such that it may be difficult to secure bonding reliability. Thus, as illustrated in FIG. 2, an entire circumferential surface of an upper end of the second post wiring 72b may be bonded to the surface wiring 76. Accordingly, the upper end of the second post wiring 72b may be disposed to penetrate the surface wiring 76. The configuration described above may be implemented by forming the groove 45 to allow the entire circumferential surface of the upper end of the second wiring 72b to be exposed externally of the sealing portion 40 in a process of forming the groove 45, as illustrated in FIG. 3C.

The upper end of the second post wiring 72b described herein may refer to a portion of the second post wiring 72b disposed to protrude externally of the sealing portion 40 and disposed in the groove 45, or may refer to a portion having a predetermined length configured to be in contact with the surface wiring 76.

An upper end surface of the second post wiring 72b may be disposed on the same plane as the upper surface of the sealing portion 40 or an external surface of the surface wiring 76. However, the second post wiring 72b is not limited to this configuration, and an upper end of the second post wiring 72b may be embedded in the surface wiring 76 such that the upper end surface of the second post wring 72b may not be exposed externally of the surface wiring 76.

By the configuration described above, a bonding area between the second post wiring 72b and the surface wiring 76 may increase, and accordingly, even when a diameter of the second post wiring 72b is relatively small, bonding reliability between the second post wiring 72b and the surface wiring 76 may be secured.

In FIG. 2, the post wirings 72 are illustrated as including both the first post wiring 72a and the second post wiring 72b for ease of description. However, the disclosure is not limited to the illustrated embodiment, and the post wirings 72 may include only the first post wirings 72a or only the second post wirings 72b, according to a size of a diameter of the post wirings 72.

In the electronic device module 100, the electronic device 1 may be electrically connected to the substrate 10 or another electronic device 1 through the roof wiring 70 passing the surface of the sealing portion 40.

Generally, when the electronic devices 1 are electrically connected to each other, or the substrate 10 is electrically connected to the electronic device 1, and there is no area on the substrate 10 in which a wiring is disposed, a size of the substrate 10 may need to be increased. However, in the electronic device module 1, an additional wiring may be disposed using the sealing portion 40, rather than the substrate 10, such that the electronic devices 1 may be electrically connected to each other or the substrate 10 without increasing a volume of the substrate 10 or the electronic device module 1.

Also, since the surface wiring 76 included in the roof wiring 70 may be disposed in the groove 45 formed in a surface of the sealing portion 40, the surface wiring 76 may not protrude externally of the sealing portion 40. Accordingly, even when the electronic device module 100 in the example embodiment includes the roof wiring 70, a thickness of the electronic device module may be maintained to the same as in the absence of the roof wiring 70.

Figure 3A:
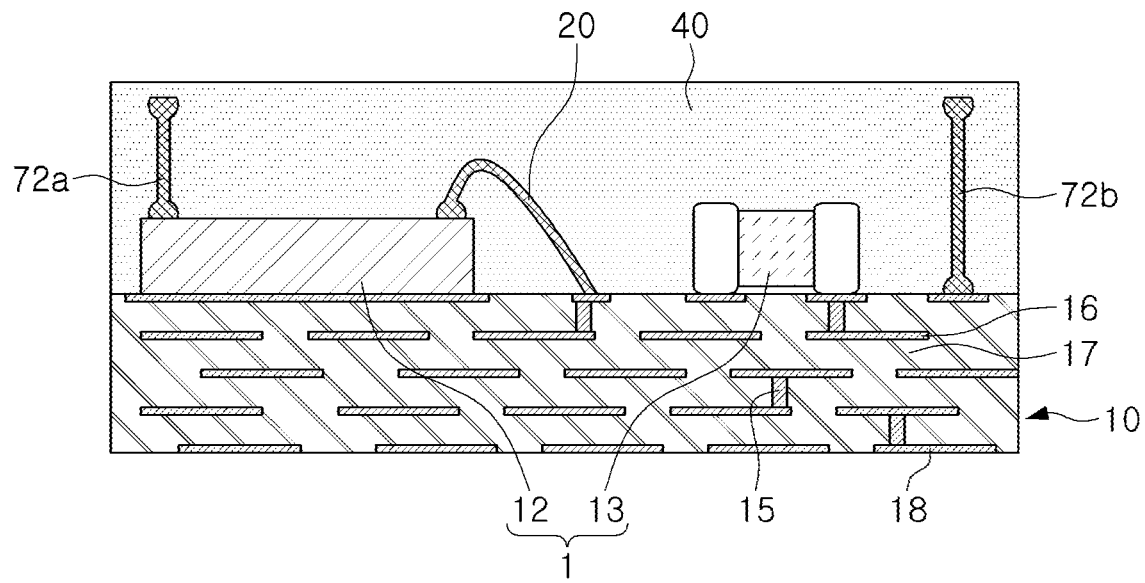
FIGS. 3A to 3C are cross-sectional diagrams illustrating a method of manufacturing the electronic device module of in FIG. 2, according to an embodiment.
Figure 3B:
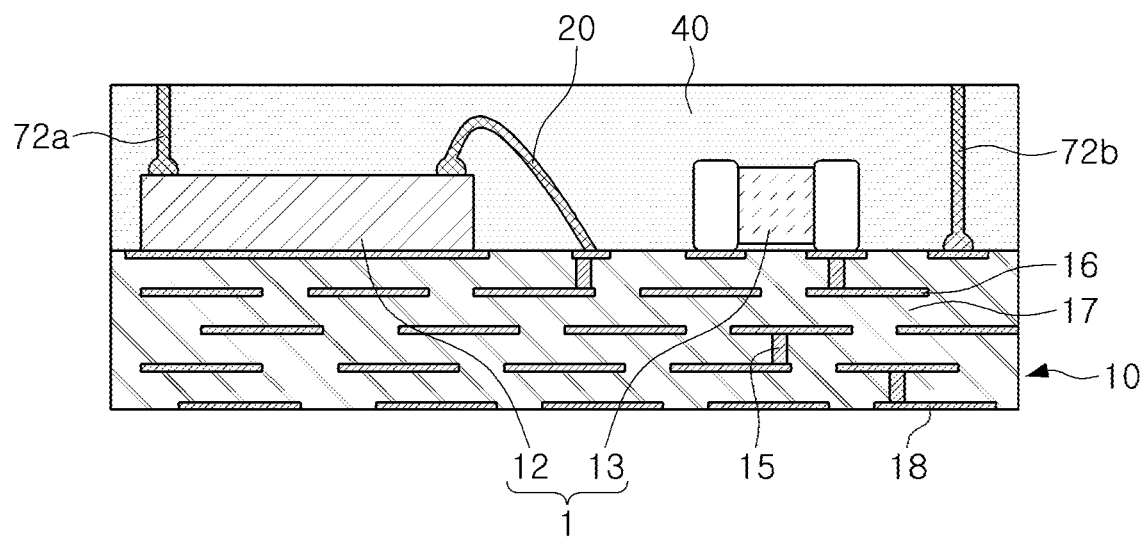
Figure 3C:
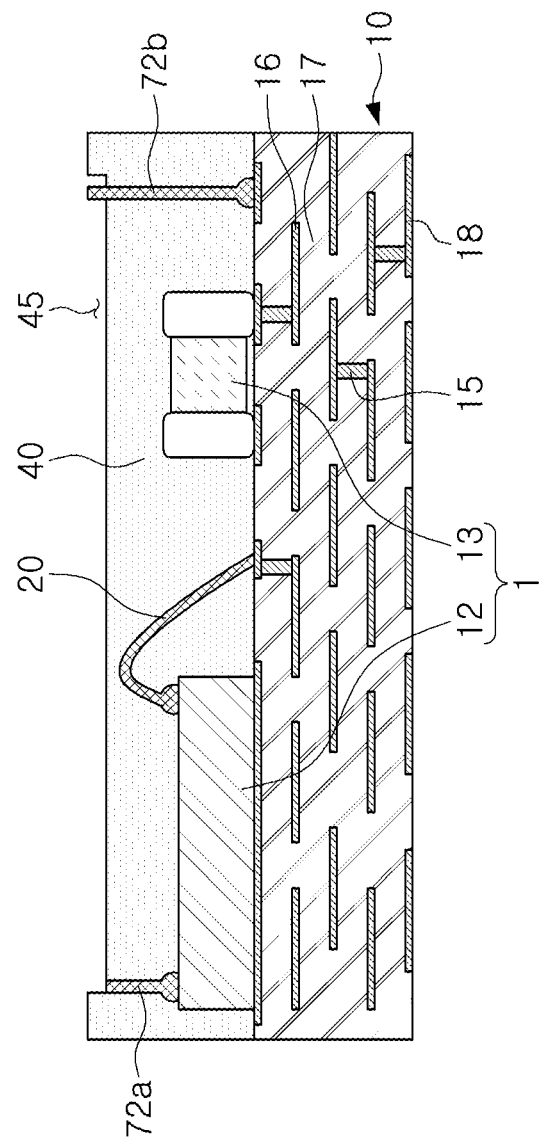

FIGS. 3A to 3C are cross-sectional diagrams illustrating a method of manufacturing the electronic device module 100, according to an embodiment.

Referring to FIG. 3A, the electronic devices 1 may be mounted on a first surface of the substrate 10.

The substrate 10 in the example embodiment may be configured as a multilayer circuit including a plurality of layers, and may include the plurality of wiring layers 16 electrically connected to each other.

A substrate (hereinafter, a strip substrate) having a panel form or a strip form may be used as the substrate 10. The strip substrate may be used to simultaneously manufacture a plurality of electronic device modules 100, and the strip substrate 10 may include a plurality of individual package regions divided from each other, and a plurality of electronic devices 1 may be manufactured simultaneously in the plurality of individual package regions.

At least one of the electronic devices 1 may be electrically connected to the wiring layer 16 of the substrate 10 through the bonding wire 20. Accordingly, a process of mounting the electronic devices 1 may include a process of seating the electronic devices 1 on the substrate 10 and a process of electrically connecting the electronic devices 1 to the substrate 10 using the bonding wire 20. However, the disclosure is not limited to this embodiment, and the electronic device 1 may be bonded to the substrate 10 through a conductive adhesive such as solder.

The electronic device 1 may include both an electronic device 12 electrically connected to the substrate 10 through the bonding wire 20 and an electronic device 13 electrically connected to the substrate 10 through a conductive adhesive. However, the disclosure is not limited to this example, and all the electronic devices 1 may be configured to be connected to the substrate 10 in the same manner.

The electronic device module 100 may use the bonding wire 20 as the post wiring 72 (e.g., the first post wiring 72a and the second post wiring 72b) as described above. Accordingly, the post wiring 72 may be formed in a wire bonding process for bonding the bonding wire 20 to the substrate 10 and the electronic device 1.

Thereafter, the sealing portion 40 may be formed on the first surface of the substrate 10, thereby sealing the electronic devices 1 and the post wiring 72.

The sealing portion 40 may be formed on the entire first surface of the substrate 10. Accordingly, the sealing portion 40 may be configured such that the entire electronic devices 1 may be embedded in the sealing portion 40. The sealing portion 40 may be manufactured by forming an insulating material such as an epoxy molding compound (EMC) by a transfer molding method, but a method of manufacturing the sealing portion 40 is not limited to this example.

When the strip substrate 10 is used, the sealing portion 40 may be formed in an integrated form to cover entire individual package regions of the strip substrate 10. However, if desired, the sealing portion 40 may be divided into individual package regions.

Thereafter, as illustrated in FIG. 3B, the post wiring 72 may be exposed externally of the sealing portion 40 by partially removing the sealing portion 40. In the process of partially removing the sealing portion 40, an upper portion of the sealing portion 40 may be removed by a grinder. Accordingly, the upper portion of the sealing portion 40 may be removed such that a thickness of the sealing portion 40 is reduced, and the portion of the sealing portion 40 may be removed until the post wiring 72 is exposed.

Thereafter, as illustrated in FIG. 3C, the groove 45 may be formed by partially removing the sealing portion 40. The groove 45 may be formed by removing another portion of the sealing portion 40 according to a position in which the surface wiring 76 is to be formed. The groove 45 may have a predetermined width and depth, and may be formed linearly. However, the disclosure is not limited to this example, and a width and a depth of the groove 45 may be varied.

As described above, an upper end surface of the first post wiring 72a may be configured to be in contact with the surface wiring 76, and a circumferential surface of the second post wiring 72b may be configured to be in contact with the surface wiring 76.

To this end, the first post wiring 72a may be partially removed together with the sealing portion 40 in a process of forming the groove 45. Accordingly, as illustrated in FIG. 3C, the upper end surface of the first post wiring 72a may be disposed on the same plane as a bottom surface of the groove 45.

Also, an upper end of the second post wiring 72b may not be removed in the process of forming the groove 45, and only a part of the sealing portion 40 in contact with a circumferential surface of the upper end of the second post wiring 72b may be partially removed. Accordingly, the upper end of the second post wiring 72b may be disposed to protrude into the groove 45.

The groove 45 may be formed by partially removing the sealing portion 40 using a laser. However, the groove 45 is not limited to being formed by a laser, and various generally used techniques may be employed to form the groove 45.

Thereafter, the surface wiring 76 may be formed by filling the groove 45 with a conductive material and curing the conductive material. Accordingly, the electronic device module 100, as illustrated in FIG. 2, may be completed. The conductive material may be prepared in a form of paste and may fill the groove 45.

A conductive adhesive such as solder paste may be used as the conductive material. Alternatively, the conductive material may include Cu, Ag, Au, Ni, Pt, Pd, or an alloy including at least one of Cu, Ag, Au, Ni, Pt, and Pd. Also, a conductive paste formed by adding conductive filler to a polymer material such as resin may be used as the conductive material. In this case, the conductive filler may include metal particles such as Au, Ag, Cu, or Ni. However, the conductive material is not limited to these examples.

The surface wiring 76 may be formed by a sputtering method, a spray method, a plating method, or the like, other than a screen-printing method using paste.

An external surface of the surface wiring 76 disposed in the groove 45 may be disposed on the same plane as a surface of the sealing portion 40. However, the surface wiring 76 is not limited to this configuration, and the surface wiring 76 may protrude externally of the sealing portion 40 or may be recessed according to a method for forming the surface wiring 76.

Regarding the manufacturing method in the example embodiment described above, the groove 45 may be formed in a surface of the sealing portion 40, and the surface wiring 76 may be formed in the groove 45.

If the surface wiring 76 were to be formed on a surface of the sealing portion 40 without forming the groove 45, a thickness of the electronic device module would increase by a thickness of the surface wiring 76. However, in the embodiment if FIGS. 1 to 3C, since the surface wiring 76 is disposed in the groove 45, the electronic module 100 including the surface wiring 76 may be formed to have a thickness the same as a thickness of an electronic device module in which the surface wiring 76 is not provided.

Also, since the surface wiring 76 is formed after the second post wiring 72b is formed to partially protrude into the groove 45, a bonding area between the second post wiring 72b and the surface wiring 76 may increase and accordingly, bonding reliability between the second post wiring 72b and the surface wiring 76 may improve.

The electronic device module 100 may not be limited to the aforementioned example embodiment, and various embodiments of the device module 100 may be made.

Figure 4:
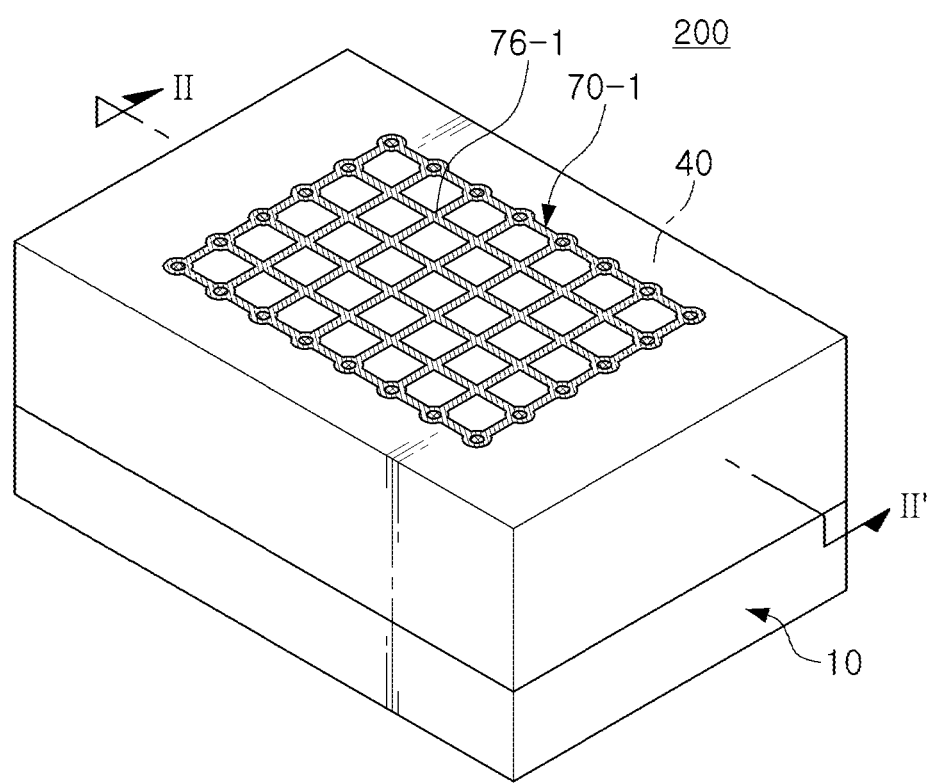
FIG. 4 is a perspective diagram illustrating an electronic device module, according to an embodiment.
Figure 5:
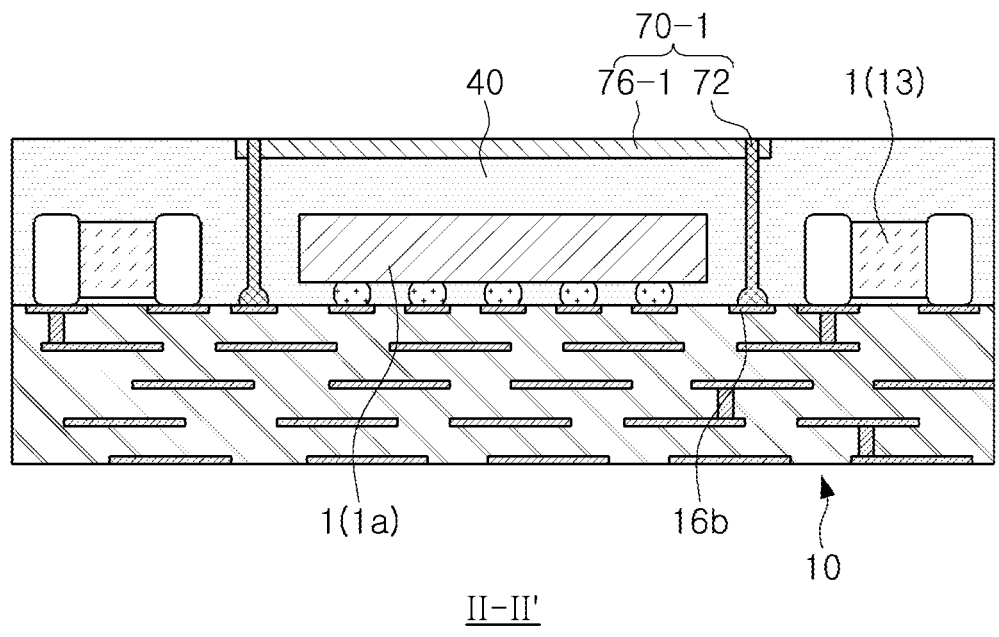
FIG. 5 is a cross-sectional diagram illustrating the electronic device module of in FIG. 4.

FIG. 4 is a perspective diagram illustrating an electronic device module 200, according to an embodiment. FIG. 5 is a cross-sectional diagram illustrating the electronic device module 200.

Referring to FIGS. 4 and 5, the electronic device module 200 may be configured similarly to the electronic device module 100 of FIGS. 1 to 3C, except that a roof wiring 70-1 may include a surface wiring 76-1 having a shape similar to a mesh.

For example, as illustrated in FIG. 4, the surface wiring 76-1 may be formed in a lattice pattern in which a plurality of horizontal linear lines and a plurality of vertical linear lines intersect each other. Also, the plurality of post wirings 72 may be disposed along a circumference of the surface wiring 76 and may be spaced apart from each other by a predetermined gap.

Accordingly, the post wiring 72 may be disposed to enclose a first device 1a along a circumference of an electronic device 1a (hereinafter, the first electronic device) disposed between the surface wiring 76-1 and the substrate 10, and the surface wiring 76-1 may be disposed to face an entire area of the first electronic device 1a on an upper portion of the first electronic device 1a.

The roof wiring 70-1, configured as above, may be used as a shielding member for shielding electromagnetic waves.

For example, the roof wiring 70-1 may shield electromagnetic waves entering the first electronic device 1a from the outside or emitting from the first electronic device 1a.

To this end, the plurality of post wirings 72 may be spaced apart from each other by a gap smaller than a wavelength of electromagnetic waves. Also, a size (e.g., a horizontal width and a vertical width) of each lattice in the surface wiring 76-1 may be configured to be smaller than a wavelength of electromagnetic waves.

Since the roof wiring 70-1 is used as a shielding member, at least one of the post wirings 72 may be electrically/physically connected to the ground electrode 16b of the substrate 10.

In the example embodiment, the post wirings 72 may include only the second post wirings 72b. However, in another example, the post wirings 72 may include the first post wiring 72a and the second post wiring 72b, or the post wirings 72 may include only the first post wirings 72a.

In the electronic device module 200, since the shielding member may be formed using the roof wiring 70-1, the shielding member may be easily disposed in a desired area in the electronic device module 200. Accordingly, electromagnetic waves may be selectively shielded for certain devices (e.g., the electric device 1a) among two or more electronic devices 1.

Figure 6:
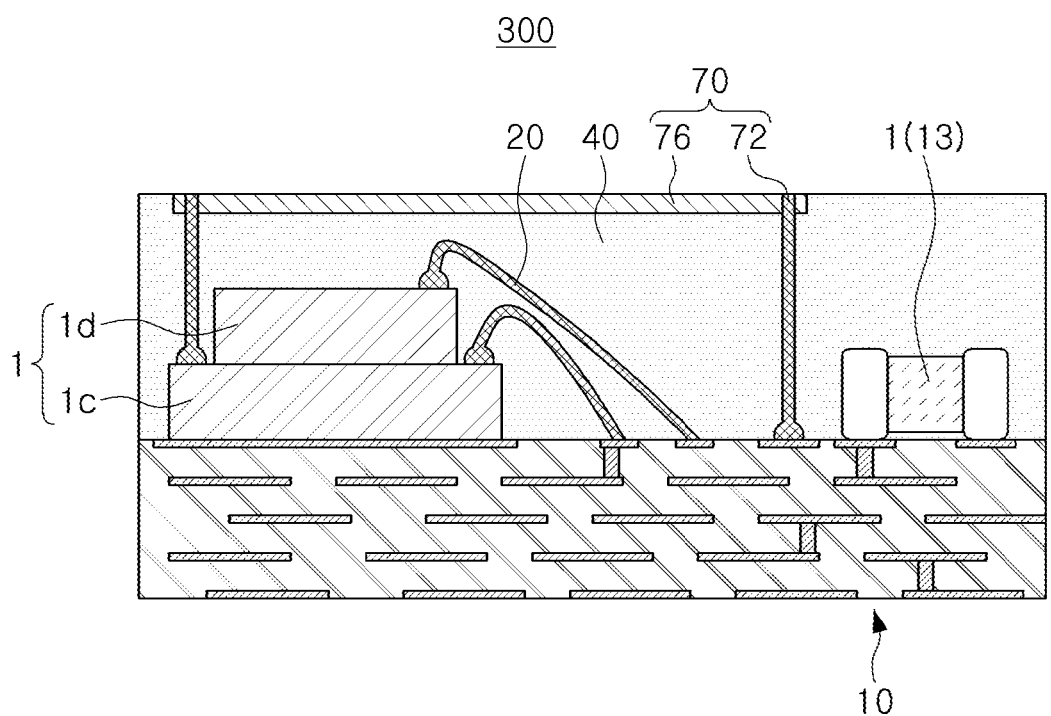
FIGS. 6 to 12 are cross-sectional diagrams illustrating electronic device modules, according to embodiments.

FIG. 6 is a cross-sectional diagram illustrating an electronic device module 300, according to an embodiment.

In the electronic device module 300, electronic devices 1 may be stacked. Also, an electronic device 1c (hereinafter a lower electronic device), among the stacked electronic devices 1, disposed on a relatively lower portion of the stacked electronic devices 1 may be electrically connected to the substrate 10 through the roof wiring 70.

An electronic device 1d (hereinafter, an upper electronic device), among the stacked electronic devices 1, disposed on an upper portion of the stacked electronic devices 1 may be configured to have a size smaller than a size of the lower electronic device 1c. For example, the upper electronic device 1d may have a planar area smaller than that of an upper surface of the lower electronic device 1c.

When the stacked electronic devices 1 are connected to the substrate 10 through the bonding wires 20, as in the example embodiment, it may not be easily to dispose the bonding wire 20 on the lower electronic device 1c due to the upper electronic device 1d. For example, when the bonding wire 20 is used instead of the roof wiring 70 illustrated in FIG. 6, a thickness of the sealing portion 40 may need to be greatly increased.

However, since the electronic device module 300 uses the roof wiring 70, a volume of the electronic device module 300 may be reduced and electrical connection between the electronic devices 1 and the substrate 10 may be available.

In the example embodiment, the post wirings 72 may include only the second post wirings 72b and may be bonded to the surface wiring 76. However, the disclosure is not limited to this example, and the post wirings 72 may include the first post wiring 72a (FIG. 2) and the second post wiring 72b, or may include only the first post wirings 72a.

Also, in FIG. 6, although only the lower electronic device 1c is connected to the roof wiring 70, the disclosure is not limited to this example, and various modifications may be made. For example, only the upper electronic device 1d may be configured to be connected to the roof wiring 70 or each of the upper electronic device 1d and the lower electronic device 1c may be connected to the roof wiring 70.

Figure 7:
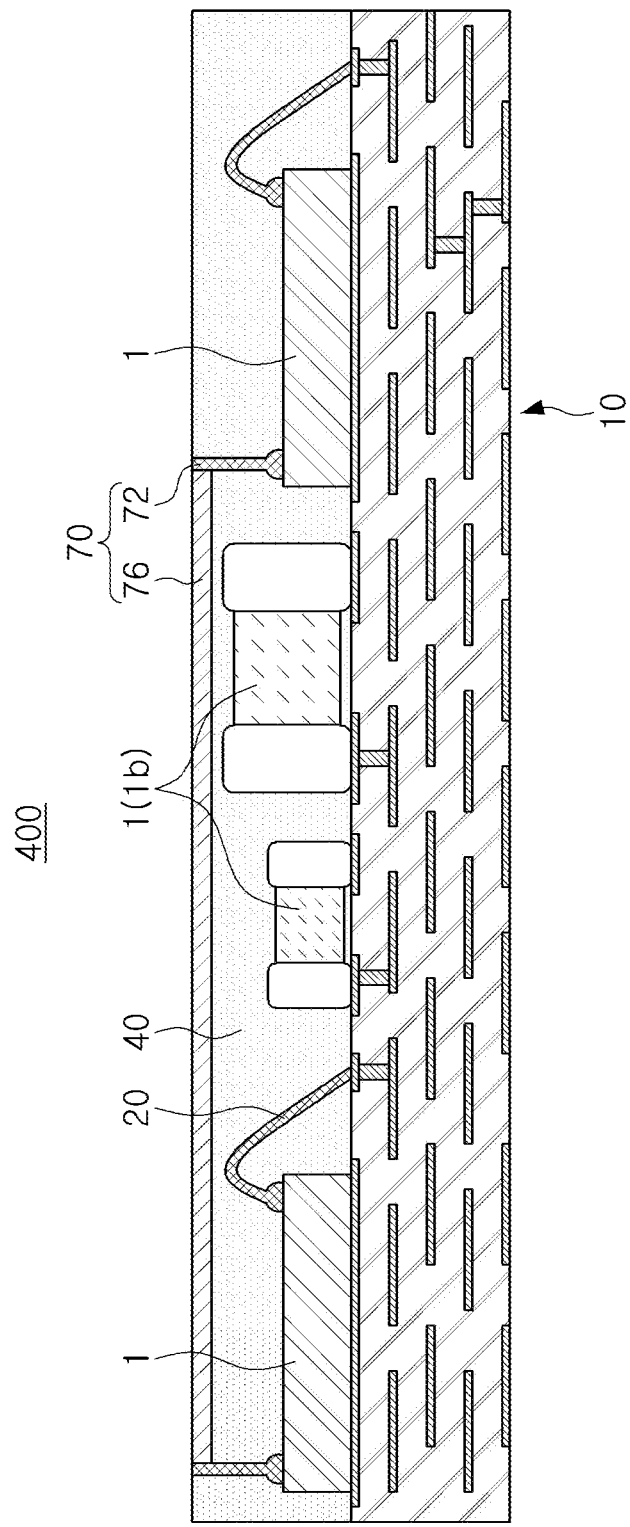

FIG. 7 is a cross-sectional diagram illustrating an electronic device 400, module according to an embodiment. In the electronic device module 400, the roof wiring 70 may be configured to electrically connect electronic devices 1 to each other.

Since the surface wiring 76 of the roof wiring 70 is disposed along the surface of the sealing portion 40, various different electronic devices 1b may be disposed between two electronic devices 1 connected to each other through the roof wiring 70.

Thus, the roof wiring 70 may be used in various forms when two electronic devices 1 to be electrically connected to each other are spaced apart from each other and it may not be easy to electrically connect the two electronic devices 1 to each other through the wiring layer 16 of the substrate 10.

The roof wiring 70 may be configured such that the surface wiring 76 may not cover entire circumferential surfaces of upper ends of the post wirings 72 and may only be in contact with portions of the circumferential surfaces of the post wirings 72 and may be bonded to the post wirings 72. Accordingly, only portions of the circumferential surfaces of the upper ends of the post wirings 72 may be bonded to the surface wiring 76, and the other portions of the post wirings 72 may be bonded to the sealing portion 40. This configuration may be implemented by exposing only portions of the circumferential surfaces of the upper ends of the post wirings 72 into the groove 45 and forming the surface wirings 76 in a process of forming the groove 45.

In this case, a bonding area may be reduced as compared to a case in which the post wirings 72 include the second wiring 72b illustrated in FIG. 2, but the bonding area may increase by increasing the thickness of the surface wiring 76, which corresponds to the depth of the groove 45. The bonding structure of the surface wiring 76 and the post wirings 72 may be varied in consideration of bonding reliability.

Figure 8:
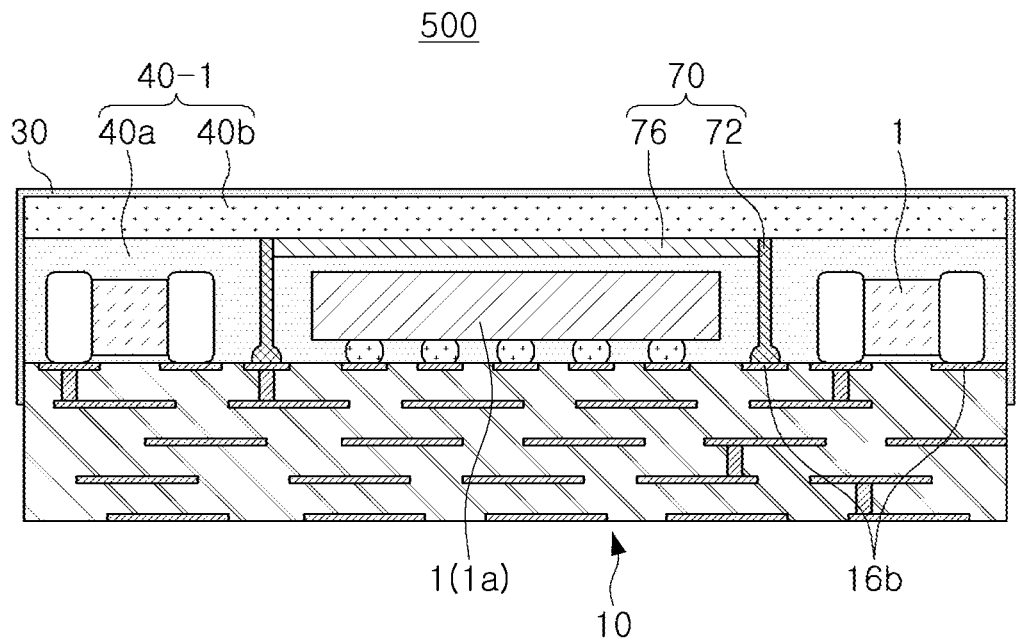

FIG. 8 is a cross-sectional diagram illustrating an electronic device module 500, according to an embodiment.

The electronic device module 500 may be configured similarly to the electronic device module illustrated in FIG. 5, and may further include a shielding film 30. Also, a sealing portion 40-1 may include a first sealing portion 40a and a second sealing portion 40b.

The first sealing portion 40a may be configured the same as the sealing portion 40 in FIG. 5. Thus, a detailed description of the first sealing portion 40a will not be repeated.

The second sealing portion 40b may be disposed to cover one surface (e.g., the upper surface) of the first sealing portion 40a on which the surface wiring 76 is disposed. Accordingly, the surface wiring 76 may be completely embedded between the first sealing portion 40a and the second sealing portion 40b. The second sealing portion 40b may be configured to cover an entire surface of the first sealing portion 40a. However, the disclosure is not limited to the aforementioned configuration, and the second sealing portion 40b may partially cover one surface of the first sealing portion 40a.

The second sealing portion 40b may be disposed to completely cover the surface wiring 76, but is not limited to this configuration.

The second sealing portion 40b may be formed of the same material as that of the first sealing portion 40a, but is not limited to being formed of the same material as that of the first sealing portion 40a, and various insulating materials may be used for the second sealing portion 40b.

The shielding film 30 may be disposed in a form of a thin film along surfaces of the first sealing portion 40a and the second sealing portion 40b (e.g. along side surfaces of the first sealing portion 40a and the second sealing portion 40b, and an upper surface of the second sealing portion 40b).

The shielding film 30 may be formed of a conductive material such as a metal material (e.g., Cu, Ag, Au, Ni, Pt, Pd, or an alloy including at least one of Cu, Ag, Au, Ni, Pt, and Pd), and may extend to a side surface of the substrate 10 and may be electrically connected to the ground electrode 16b exposed to a side surface of the substrate 10.

The shielding film 30 may be formed by applying a resin material including conductive powder on an outer surface of the sealing portion 40-1 or by forming a metal thin film on the outer surface of the sealing portion 40-1. For example, the shielding film 30 may be a metal thin film formed on the outer surface of the sealing portion 40-1 by a sputtering method. However, the shielding film 30 is not limited to this example, and various techniques such as a spray coating method, a screen-printing method, a vapor deposition method, an electrolytic plating method, and a non-electrolytic plating method may be used to form the metal thin film.

In the electronic device module 500, a double shielding structure may be formed by the roof wiring 70 and the shielding film 30. Accordingly, a shielding effect may be improved.

Figure 9:
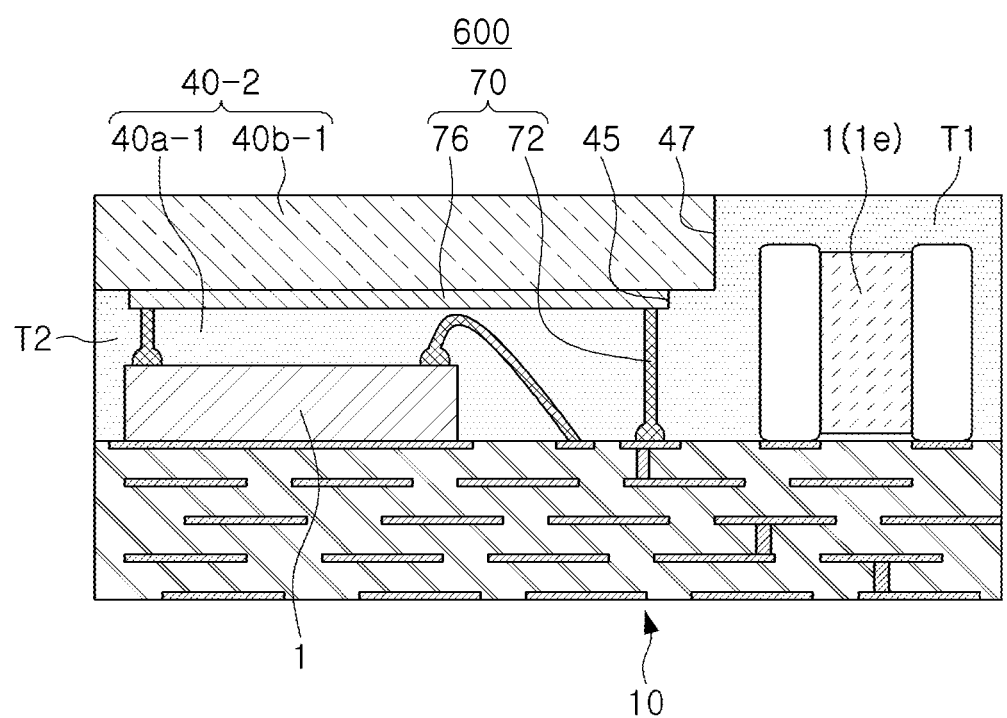

FIG. 9 is a cross-sectional diagram illustrating an electronic device module 600, according to an embodiment.

The electronic device module 600 may include a sealing portion 40-2 including a first sealing portion 40*a*-1 and a second sealing portion 40*b*-1. Also, a manufacturing process may include a process of forming a groove-shaped trench 47 by partially removing the first sealing portion 40*a*-1, a process of forming the surface wiring 76 on a bottom surface of the trench 47, and a process of forming the second sealing portion 40*b* to cover the surface wiring 76 and to fill the trench 47.

A grinding method using a grinder may be used to form the trench 47. The trench 47 may be configured as a stepped portion having a staircase form. However, the trench 47 is not limited to this configuration, and may be formed as in the example illustrated in FIG. 11.

The trench 47 may be formed by partially removing the first sealing portion 40*a*-1. Accordingly, the first sealing portion 40*a*-1 may include a first thickness portion T1 and a second thickness portion T2 having a thickness less than a thickness of the first thickness portion T1. The second thickness portion T2 may be defined as a region having a thickness less than a thickness of the other portion as the trench 47 is formed.

The first sealing portion 40*a*-1 may be formed similarly to the sealing portion 40 illustrated in FIG. 2 described above. Accordingly, a detailed description of the first sealing portion 40*a*-1 will not be repeated.

The second sealing portion 40*b*-1 may be layered on the second thickness portion T2, and may be disposed to completely cover the surface wiring 76. However, the second sealing portion 40*b*-1 is not limited to such a configuration, and the surface wiring 76 may be configured to be partially exposed.

The second sealing portion 40*b*-1 may be formed of the same material as the first sealing portion 40*a*-1, but is not so limited. Various insulating materials may be used for the second sealing portion 40*b*-1.

The electronic devices 1 may include at least one electronic device 1*e* (hereinafter, a large-sized electronic device) having a height greater than that of the roof wiring 70. Accordingly, a distance (e.g., a height of the roof wiring 70) between the substrate 10 and the surface wiring 76 may be less than a height of the large-sized electronic device 1*e*.

Accordingly, a process of partially removing the first sealing portion 40*a*-1 in the manufacturing method of electronic device module 600 may be a process of selectively removing a region of the first sealing portion 40*a*-1 in which the large-sized electronic device 1*e* is not disposed.

As described above, a bonding wire may be used for the post wirings 72. In this case, it may be difficult for the post wirings 72 to have a height of 400 um or greater. Thus, when a mounting height of the large-sized electronic device is 400 μm or greater, it may be difficult to connect the substrate 10 and the surface wiring 76 to each other using the post wirings 72. To this end, the electronic device module 600 may include the first sealing portion 40*a*-1 having a portion thereof removed such that a distance between the surface wiring 76 and the substrate 10 may be reduced.

Accordingly, the electronic device module 600 may include the large device 1*e* and may also use the roof wiring 70 at the same time.

Figure 10:
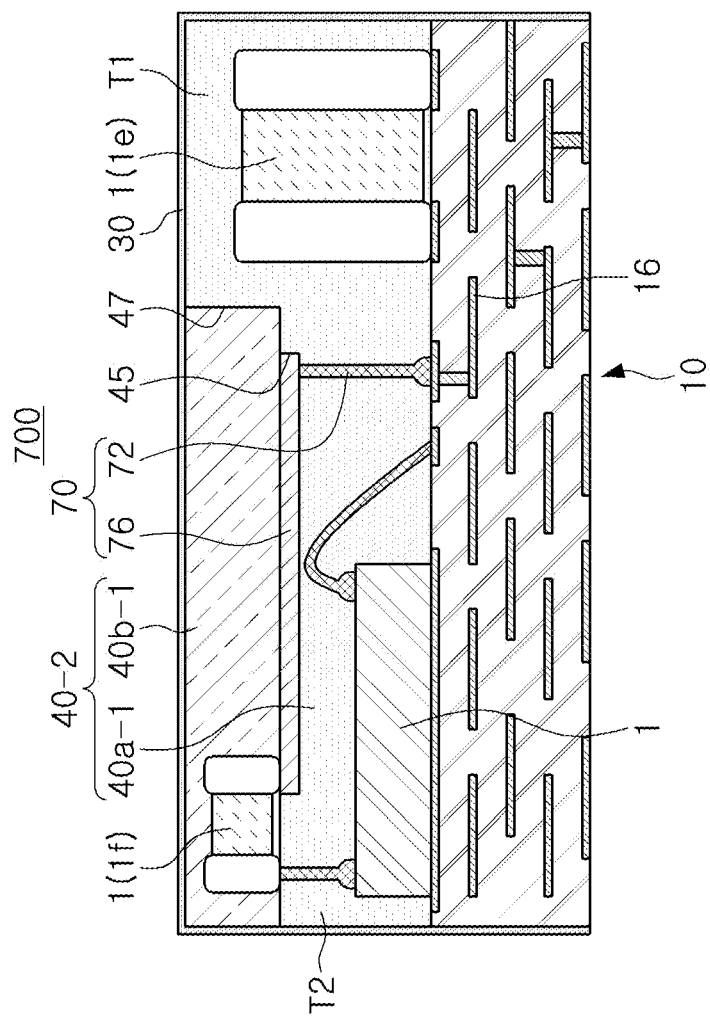

FIG. 10 is a cross-sectional diagram illustrating an electronic device module 700, according to an embodiment.

The electronic device module 700 may be configured similarly to the electronic device 600 module illustrated in FIG. 9, except that at least one of the electronic devices 1 (the element 1*f*; hereinafter, a second electronic device) may be mounted on a surface of the first sealing portion 40*a*-1.

The second device 1*f* may be bonded to one of the post wirings 72 and the surface wiring 76 and may electrically connect the one of the post wirings 72 to the surface wiring 76. Accordingly, the one of the post wirings 72 and the surface wiring 76 may not be directly connected to each other and may be electrically connected to each other via the second device 1*f*.

However, an example embodiment thereof is not limited thereto, and both ends of the second device 1*f* may be configured to be bonded to the surface wiring 76. In this case, the post wiring 72 and the surface wiring 76 may be connected to each other, and the second electronic device 1*f* may be mounted on the surface wiring 76.

Since the second electronic device 1*f* is mounted on a surface of the first sealing portion 40*a*-1, the second electronic device 1*f* may be embedded in the second sealing portion 40*b*-1. However, the second electronic device 1*f* may be configured to be partially exposed externally of the second sealing portion 40*b*-1, or the second sealing portion 40*b*-1 may not be provided.

The second sealing portion 40*b*-1 may be disposed to completely cover the surface wiring 76. However, the second sealing portion 40*b*-1 is not limited to such a configuration. For example, when the roof wiring 70 is used as a shielding member, a portion of the surface wiring 76 may be exposed externally of the second sealing portion 40*b*-1 and may be bonded to the shielding film 30.

Similarly to the embodiment of FIG. 8, the shielding film 30 may be disposed in a form of a thin film along surfaces of the first sealing portion 40*a*-1 and the second sealing portion 40*b*-1.

The shielding film 30 may be formed of a conductive material such as a metal material (e.g., Cu, Ag, Au, Ni, Pt, Pd, or an alloy including at least one of Cu, Ag, Au, Ni, Pt, and Pd), may extend to a side surface of the substrate 10, and may be electrically connected to the wiring layer 16 (e.g., a ground wiring) exposed to the side surface of the substrate 10. Alternatively, for example, the shielding film 30 may be connected to the ground electrode 16*b* similarly to the embodiment illustrated in FIG. 9.

Figure 11:
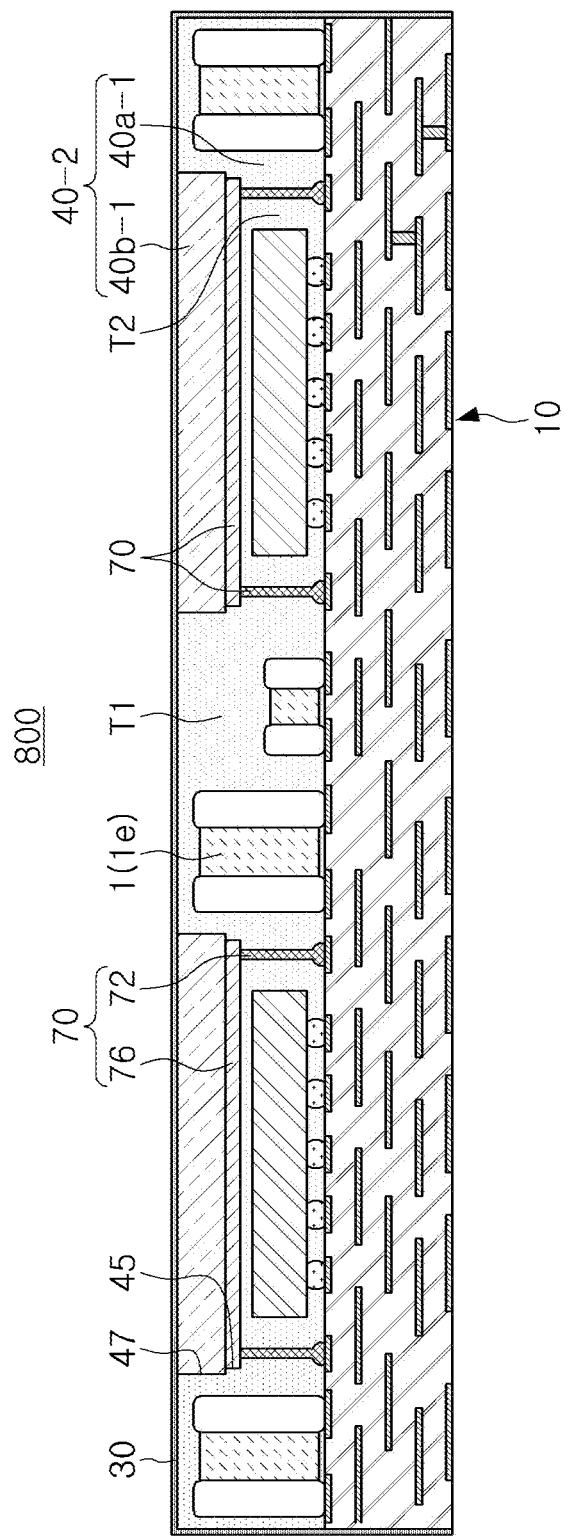

FIG. 11 is a cross-sectional diagram illustrating an electronic device module 800, according to an embodiment. The electronic device module 800 may include a double shielding structure similar to the electronic device module 500 illustrated in FIG. 8.

For example, the electronic device module 800 may include a plurality of roof wirings 70 spaced apart from each other. Also, at least one electronic device 1 (e.g., the large-sized electronic device 1*e*) may be disposed between the plurality of roof wirings 70.

A method of manufacturing the electronic device module 800 may include a process of forming the trench 47 in the first sealing portion 40*a*-1, a process of forming a groove in a bottom surface of the trench 47 and disposing the surface wiring 76 therein, and a process of disposing the second sealing portion 40*b*-1 in the trench 47 and embedding the surface wiring 76 therein.

The trench 47 may be formed only in an area in which the surface wiring 76 is disposed, and may be formed to have an area similar to an area of the surface wiring 76. Accordingly, a plurality of trenches 47 may be spaced apart from each other by a predetermined distance, and may be selectively disposed in a region corresponding to the surface wiring 76.

Accordingly, the electronic device 800 may reduce a distance between the surface wiring 76 and the substrate 10, and the large-sized device 1e having a height greater than that of the roof wiring 70 may be disposed between the trenches 47 that are spaced apart from each other.

Accordingly, even when the double shielding structure and the large-sized device 1e are included, a thickness of the electronic device module 800 may be reduced.

Since the electronic device module 800 includes the trench 47, the first sealing portion 40a-1 may include a first thickness portion T1 and a second thickness portion T2 having a thickness less than a thickness of the first thickness portion T1, similarly to the example illustrated in FIG. 9. The second thickness portion T2 may be a region having a thickness less than thicknesses of the other portions as the trench 47 is formed.

Figure 12:
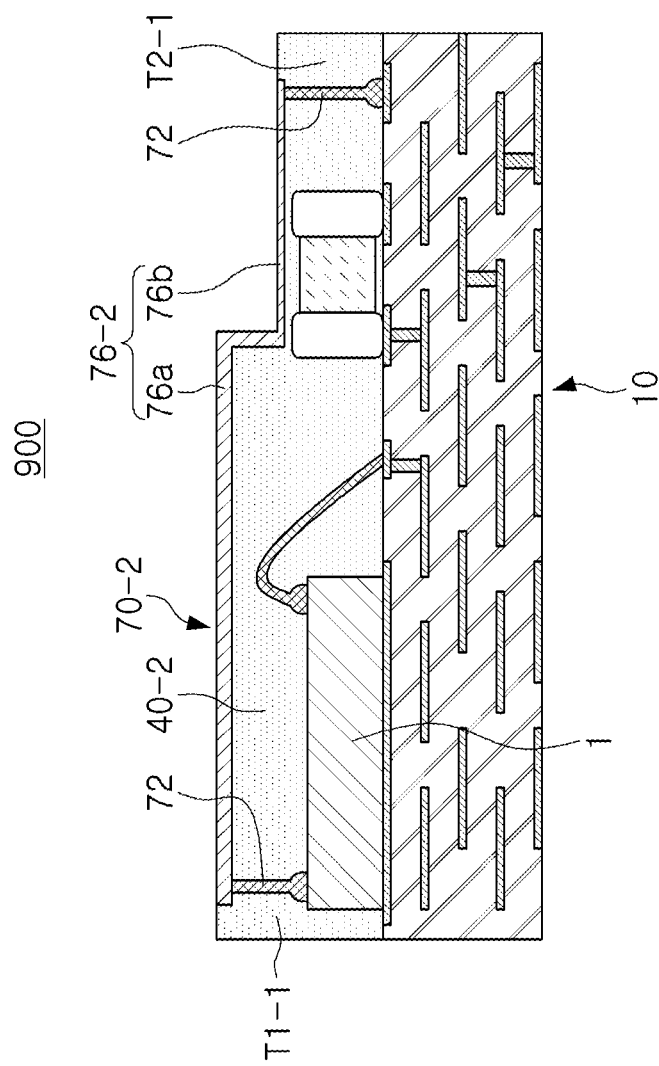
Figure 13A:
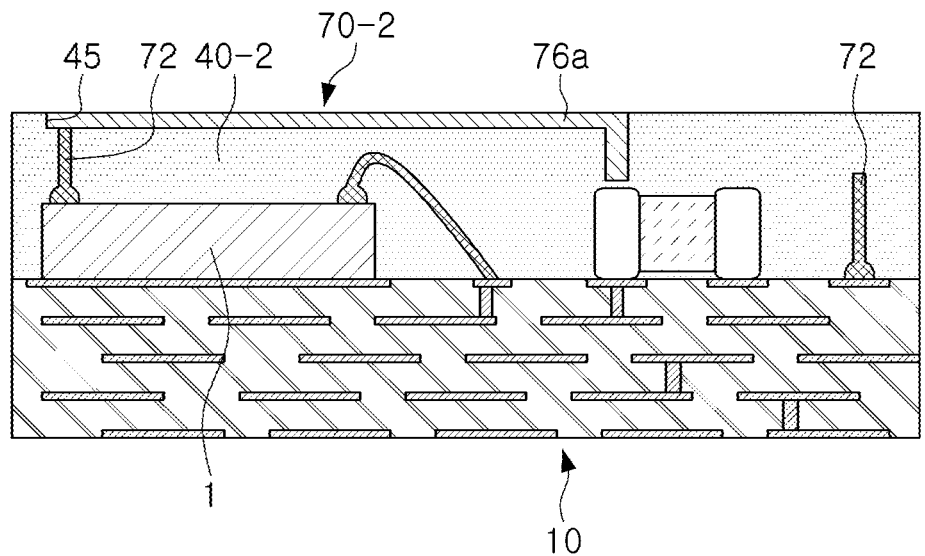
FIGS. 13A and 13B are cross-sectional diagrams illustrating a method of manufacturing the electronic device module illustrated in FIG. 12, according to an embodiment.
Figure 13B:
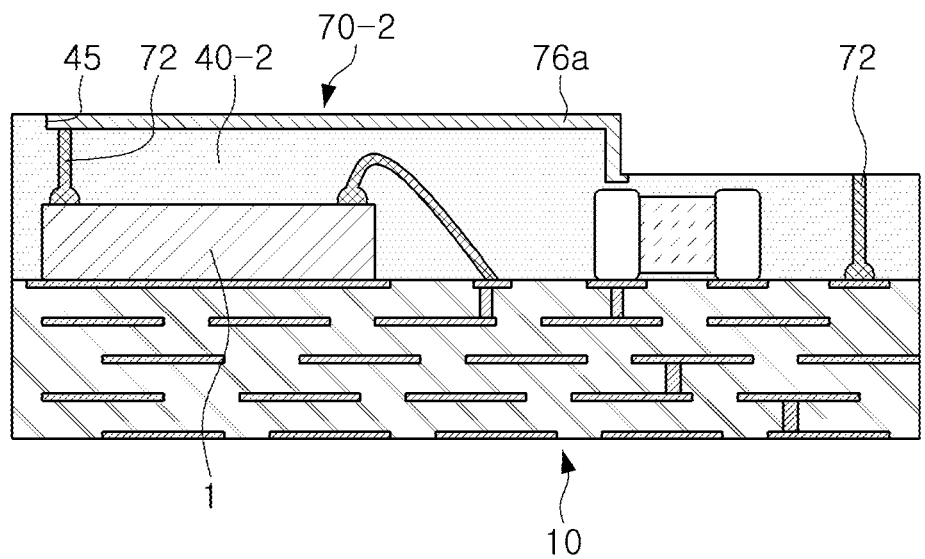

FIG. 12 is a cross-sectional diagram illustrating an electronic device module 900, according to an embodiment. FIGS. 13A and 13B are cross-sectional diagrams illustrating a method of manufacturing the electronic device module illustrated 900.

Referring to FIG. 12, in the electronic device module 900, a stepped portion may be formed in a sealing portion 40-2. For example, the sealing portion 40-2 may include a first thickness portion T1-1 and a second thickness portion T2-2 having a thickness less than a thickness of the first thickness portion T1-1. The second thickness portion T2-1 may be a region having a thickness less than thicknesses of the other portions of the sealing portion 40-2.

A roof wiring 70-2 may include a surface wiring 76-2 disposed along a surface of the sealing portion 40-2 in which a stepped portion is formed. Accordingly, at least one of the two post wirings 72 may be disposed in the first thickness portion T1-1 and at least one of the two post wirings 72 may be disposed in the second thickness portion T2-1. Accordingly, upper ends of the two post wirings 72 may be disposed on different planes, respectively, and the surface wiring 76 may be disposed along two different planes and a stepped portion having a staircase form which connects the two-different planes such that the surface wiring 76 may connect the two post wirings 72 to each other.

The step portion may be formed in a staircase form, but is not limited to such a configuration. For example, the stepped portion may be formed with an inclined surface or a curved surface. Also, various modifications may be made such that an entire upper surface of the sealing portion 40-2 may be formed with an inclined surface.

When the stepped portion is formed as in FIG. 12, a length of the post wiring 72 connecting the substrate 10 to the surface wiring 76 may be reduced. Also, since a thickness of the electronic device module 900 may be partially reduced, an electronic device on which the electronic device module 900 is mounted may have a reduced size.

In the description below, a method of manufacturing the electronic device module 900, according to an embodiment, will be described.

As illustrated in FIG. 13A, the sealing portion 40-2 covering electronic devices 1 and a pose wiring 72 may be formed, and a first section 76a of the surface wiring 76-2 may be formed on a surface of a sealing portion 40-2. In this process, the groove 45 may be formed in a surface of the sealing portion 40-2 and the groove 45 may be filled with a conductive material, similarly to the process described with reference to FIG. 3C.

In this process, an end of the first section 76a which is not connected to the post wiring 72 may be disposed deeply in the sealing portion 40-2, more deeply than the other portions of the first section 76a. This configuration may be implemented by forming the groove 45 having a relatively deep depth in the respective portion and filling the groove 45 with a conductive material.

The depth of the groove 45 in which the above-described end of the first section 76a is disposed may be formed to have a depth equal to or deeper than a thickness (or a size of a stepped portion) of the sealing portion 40-2 removed in a subsequent process.

The sealing portion 40-2 may be partially removed as illustrated in FIG. 13B. Accordingly, a stepped portion may be formed in the sealing portion 40-2.

A grinding method using a grinder may be used to partially remove the sealing portion 40-2.

The sealing portion 40-2 may be removed until an upper end of the post wiring 72 disposed below the ground region is exposed externally of the sealing portion 40-2. In this process, an end of the post wiring 72 may also be partially removed by the grinder, and accordingly, an end of the first section 76a may partially remain on a surface (e.g., a vertical surface) of the stepped portion.

Thereafter, as illustrated in FIG. 12, a second section 76b of the surface wiring 76-2 may be formed on a surface of the second thickness portion T2-1. The second section 76b may be a section connecting an end of the first section 76a to the upper end of the post wiring 72 exposed externally of the sealing portion 40-2. The second section 76b may be formed by a method similar to the method for forming the first section 76a.

According to the aforementioned example embodiments, an electronic device module may protect an electronic device mounted on a substrate from an external environment through a sealing portion or a roof wiring, and may also easily shield electromagnetic waves.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module, comprising:
   a substrate;
   a sealing portion disposed on the substrate;
   at least one electronic device mounted on the substrate and embedded in the sealing portion; and
   a roof wiring at least partially disposed on a surface of the sealing portion and electrically connecting the substrate to the at least one electronic device or two or more of the at least one electronic device to each other when the at least one electronic device comprises two or more electronic devices, wherein the roof wiring comprises:
a surface wiring disposed on one surface of the sealing portion; and
at least two post wirings connected by the surface wiring and connecting the surface wiring to the substrate or to the at least one electronic device,
wherein circumferential surfaces of the at least two post wirings are bonded to the surface wiring, and
wherein the sealing portion comprises a first sealing portion on a surface of which the surface wiring is disposed, and a second sealing portion covering the surface wiring and layered on the first sealing portion.

2. The electronic device module of claim 1, wherein an entire circumferential surface of an upper portion of at least one of the at least two post wirings protruding externally of the sealing portion is bonded to the surface wiring.

3. The electronic device module of claim 1, wherein a circumferential surface of an upper portion of at least one of the at least two post wirings is bonded to the surface wiring, and a circumferential surface of another portion of the at least one of the at least two post wirings is bonded to the sealing portion.

4. The electronic device module of claim 1, wherein at least one of the at least two post wirings is formed of a bonding wire.

5. The electronic device module of claim 1, wherein the roof wiring electrically connects at least two electronic devices that are spaced apart from each other, and
wherein another electronic device, among the two or more electronic devices, is disposed between the at least two electronic devices.

6. The electronic device module of claim 1, wherein the electronic device module further comprises a shielding film disposed along outer surfaces of the first sealing portion and the second sealing portion.

7. The electronic device module of claim 1, wherein the surface wiring is formed in a lattice pattern in which a plurality of horizontal linear lines and a plurality of vertical linear lines intersect each other.

8. The electronic device module of claim 1, wherein the surface wiring is disposed such that a horizontal linear line of the surface wiring and a vertical linear line of the surface wiring intersect each other.

9. The electronic device module of claim 1, wherein the at least one electronic device comprises a lower electronic device disposed on the substrate and an upper electronic device disposed on an upper surface of the lower electronic device, and
wherein either one or both of the upper electronic device and the lower electronic device are connected to the roof wiring.

10. The electronic device module of claim 1, wherein the sealing portion comprises a stepped portion disposed on a surface of the sealing portion, and
wherein the surface wiring is disposed along the surface of the sealing portion.

11. The electronic device module of claim 1, wherein the sealing portion comprises:
a first sealing portion comprising a first thickness portion having a first thickness and a second thickness portion having a second thickness less than the first thickness; and
a second sealing portion covering the surface wiring and layered on the first sealing portion.

12. The electronic device module of claim 7, wherein the at least two post wirings comprise a plurality of post wirings spaced apart from each other by a predetermined gap along a circumference of the surface wiring.

13. The electronic device module of claim 7, wherein the at least one electronic device is disposed between the surface wiring and the substrate.

14. The electronic device module of claim 11, wherein the at least one electronic device comprises a large-sized electronic device spaced apart from the roof wiring and having a height greater than a height of the roof wiring.

15. The electronic device module of claim 11, further comprising:
an electronic device disposed on a surface of the first sealing portion and bonded to the roof wiring.

16. An electronic device module, comprising:
a substrate;
an electronic device mounted on a first surface of the substrate;
at least one post wiring extending to the substrate or the electronic device;
a first sealing portion sealing the electronic device and the post wiring, and including a first thickness portion and a second thickness portion having a thickness less than a thickness of the first thickness portion;
a surface wiring disposed on a surface of the second thickness portion and connected to a post wiring among the at least one post wiring; and
a second sealing portion covering the surface wiring and layered on the second thickness portion.

17. The electronic device module of claim 16, wherein the electronic device is disposed in the second thickness portion.

18. The electronic device module of claim 17, further comprising an additional electronic device disposed in the first thickness portion,
wherein a height of the additional electronic device is greater than a height of the electronic device, in a direction of the thickness of the first thickness portion and the thickness of the second thickness portion.

* * * * *